United States Patent [19]
Peters

[11] Patent Number: 5,592,614
[45] Date of Patent: Jan. 7, 1997

[54] FAULT IDENTIFICATION SYSTEM

[75] Inventor: Michael Peters, Manchester, England

[73] Assignee: Genrad Limited, London, England

[21] Appl. No.: 754,899

[22] Filed: Sep. 4, 1991

[30] Foreign Application Priority Data

Sep. 8, 1990 [GB] United Kingdom .................. 9019718

[51] Int. Cl.$^6$ .................................................. G06F 11/22
[52] U.S. Cl. .................................................. 395/183.02
[58] Field of Search .................................. 371/25.1, 15.1; 395/61, 916, 183.02

[56] References Cited

U.S. PATENT DOCUMENTS 4,267,569  5/1981  Nygaard et al. ........................ 364/431
4,847,795  7/1989  Baker et al. ............................ 364/579

Primary Examiner—Robert W. Beausoliel, Jr.
Assistant Examiner—S. Elmore
Attorney, Agent, or Firm— Nixon & Vanderhye P.C.

[57] ABSTRACT

A system for identifying faults in an electrical circuit such as a circuit of a road vehicle. The electrical circuit is intended to provide a plurality of outputs such as lamp illumination in response to predetermined circuit conditions. Data describing individual components of the electrical circuit and the interconnections therebetween is stored. Data identifying a fault symptom is input to the system by a technician to indicate that for one said predetermined set of circuit conditions the intended output is not provided. Stored data is accessed which describes selected components which if faulty could be the cause of the fault symptom. Values of electrical variables to be expected at predetermined measurement points in a sub-circuit defined by the selected components and the connections therebetween are calculated. Measurement points are selected at which points the electrical variables are to be measured and the technician is instructed to selectively input measurement data indicating the electrical variables measured at the selected measurement points. The input measurement data is compared with the calculated electrical variables and faulty components are identified in accordance with that comparison data.

11 Claims, 15 Drawing Sheets

Which aspect of EXTERNAL LIGHTING do you wish to test? ↙504

| | |
|---|---|
| FRONT-FOG LIGHTS | Press to Select |
| HAZARD/TURN LIGHTS | Press to Select |
| HEAD LIGHTS | SELECTED |
| PARKING LIGHTS | Press to Select |
| REAR-FOG LIGHTS | Press to Select |
| REVERSING LIGHTS | Press to Select |
| STOP LIGHTS | Press to Select |

CONTINUE

Select ONE option then press CONTINUE

FIG. 6

Definite Faults

PASSENGER'S DOOR COURTESY LIGHT SWITCH is STUCK OFF

Possible Single Faults

PIN-CHASSIS in FRONT LEFT COURTESY SWITCH CONNECTOR may be OPEN CIRCUIT
PIN-1 in FRONT LEFT COURTESY SWITCH CONNECTOR may be OPEN CIRCUIT
WIRE-14 in harness BH-0001 may be OPEN CIRCUIT
WIRE-15 in harness BH-0001 may be OPEN CIRCUIT

Possible Components of Multiple Faults

PIN-1 in BATTERY NEGATIVE CONNECTOR may be OPEN CIRCUIT
PIN-1 in BATTERY POSITIVE CONNECTOR may be OPEN CIRCUIT
PIN-1 in BATTERY ISOLATOR SOURCE-SIDE CONNECTOR may be OPEN CIRCUIT
PIN-1 in BATTERY ISOLATOR LOAD-SIDE CONNECTOR may be OPEN CIRCUIT
PIN-OUTER in LEFT COURTESY LAMP CONNECTOR may be OPEN CIRCUIT
PIN-INNER in LEFT COURTESY LAMP CONNECTOR may be OPEN CIRCUIT
LEFT COURTESY LAMP may be OPEN CIRCUIT
WIRE-20 in harness BH-0001 may be OPEN CIRCUIT
WIRE-21 in harness BH-0001 may be OPEN CIRCUIT
WIRE-1 in harness BH-0001 may be OPEN CIRCUIT
WIRE-3 in harness BH-0001 may be OPEN CIRCUIT

FIG. 10

FAULT IDENTIFICATION SYSTEM

BACKGROUND OF THE INVENTION

1. Field of the Invention

The present invention relates to a system for identifying faults in an electrical circuit such as the electrical circuit of a road vehicle.

2. Related Art

Modern road vehicles have complex electrical circuits performing many functions such as engine, climate, instrumentation and lighting control. Such an electrical circuit provides many user perceivable outputs, and malfunctions of these outputs are easy to identify in a general manner, e.g. "the internal lights do not work", or "the engine runs in an irregular manner". The faults which cause these malfunctions are often simple matters, e.g. a connector going open circuit, or burn-out of a component. Generally speaking however it is not easy to diagnose the underlying fault from the symptom that the perceived output malfunction represents due to the extensive interconnection between circuits supplying different output devices and the complex nature of some of the components used, e.g. wiring harnesses and microprocessors.

Fault identification has traditionally been the responsibility of skilled service technicians provided with simple voltage and current monitoring tools and circuit diagrams of the vehicle in question. As the complexity of vehicle wiring has increased, and the differences between variations of the same vehicle model have increased, it has become progressively more difficult for technicians to diagnose electrical faults.

Diagnostic equipment is known which can be plugged into an appropriate socket provided in a motor vehicle. The socket is connected to sensors mounted on the vehicle, and these sensors deliver output signals to the diagnostic equipment which handles any appropriate signal processing. This approach has two major limitations however. Firstly, the equipment is generally only capable of monitoring a small number of variables. Secondly, the diagnostic equipment must be closely matched to the vehicle and cannot therefore be used as a general purpose tool.

U.S. Pat. Specification No. 4,267,569 describes a system in which diagnostic equipment is connected to a vehicle that carries an on-board microprocessor. In order to increase the diagnostic capability, the on-board microprocessor executes first and second subprograms under the control of the diagnostic equipment. The first subprogram gives actual system operational data to the equipment, whereas the second simulates values for specific vehicle data under various operating conditions and compares the simulated values with the actual values. Although this system does provide greater flexibility in that part of the diagnostic function is performed on the vehicle, the diagnostic equipment must still be matched to the vehicle. Thus the system can provide no help with vehicles not specifically designed for diagnosis by such equipment. Furthermore, the system is primarily concerned with identifying the existence of malfunctions in particular sections of the system, e.g. a fuel injector control circuit, rather than pinpointing faults causing those malfunctions. The final fault identification procedure is thus still left to the technician.

SUMMARY OF THE INVENTION

It is an object of the present invention to obviate or mitigate the problems outlined above.

According to the present invention there is provided a system for identifying faults in an electrical circuit intended to provide a plurality of outputs each in response to at least one predetermined set of circuit conditions, including a) apparatus storing data describing individual components and interconnections between said components that together define the electrical circuit, b) apparatus for inputting data to the system identifying a fault symptom indicating that for a said one predetermined set of circuit conditions the intended output is not provided, c) apparatus for accessing stored data describing selected components a fault in any one of which could be the cause of the said fault symptom, d) apparatus for calculating electrical variables to be expected at predetermined measurement points in a sub-circuit defined by said selected components and the connections therebetween given the said set of circuit conditions, e) apparatus for selecting measurement points in said sub-circuit at which points said electrical variables are to be measured, f) apparatus for selectively inputting measurement data indicating the electrical variables measured at said selected measurement points, g) apparatus for comparing input measurement data with said calculated electrical variables, and h) apparatus for identifying at least one faulty component from the comparison between said input measurement data and the said calculated electrical variables.

Preferably, the system includes apparatus for identifying a single component responsible for the said intended output which is not provided given said one predetermined set of circuit conditions, apparatus for inputting data to the system identifying further symptoms each indicating the output provided by said single component for a respective one of a plurality of further conditions of the said circuit, apparatus for listing components of said sub-circuit potentially contributing to each said symptoms, and apparatus for identifying components of the sub-circuit which are most likely to be the cause of said fault symptom from a comparison of the component listings.

The component identifying apparatus may be arranged to identify as a first set listed components common to all fault systems. These components are those most likely to be causing the output malfunction. Where there is a non-fault symptom, any components listed for such a symptom are preferably excluded from the first set. A second set of components may be listed for any components listed for any fault symptoms and not within the first set. Thus the first set represents a foreground of potential faults and the second set represents a background which may be assessed if testing fails to locate a fault in the first set.

The system may further comprise apparatus for identifying each set of components in said sub-circuit which defines a series circuit path extending from the said single component to a reference voltage source, and apparatus for identifying active circuit paths which control conditions at the said single component by reference to the series impedance of the components making up the respective set of components, components not contributing to the active circuit paths being excluded from said component listings.

The active circuit path identifying apparatus may further comprise apparatus for calculating the voltage change along each circuit path, means for calculating the series resistance along each circuit path, and apparatus for selecting circuit paths having relatively low series resistances.

BRIEF DESCRIPTION OF THE DRAWINGS

An embodiment of the present invention will now be described, by way of example, with reference to the accompanying drawings, in which:

FIG. 6 illustrates a functional area query example:

FIG. 10 illustrates a fault population display example;

DETAILED DESCRIPTION OF EXEMPLARY EMBODIMENTS

Figure 1:
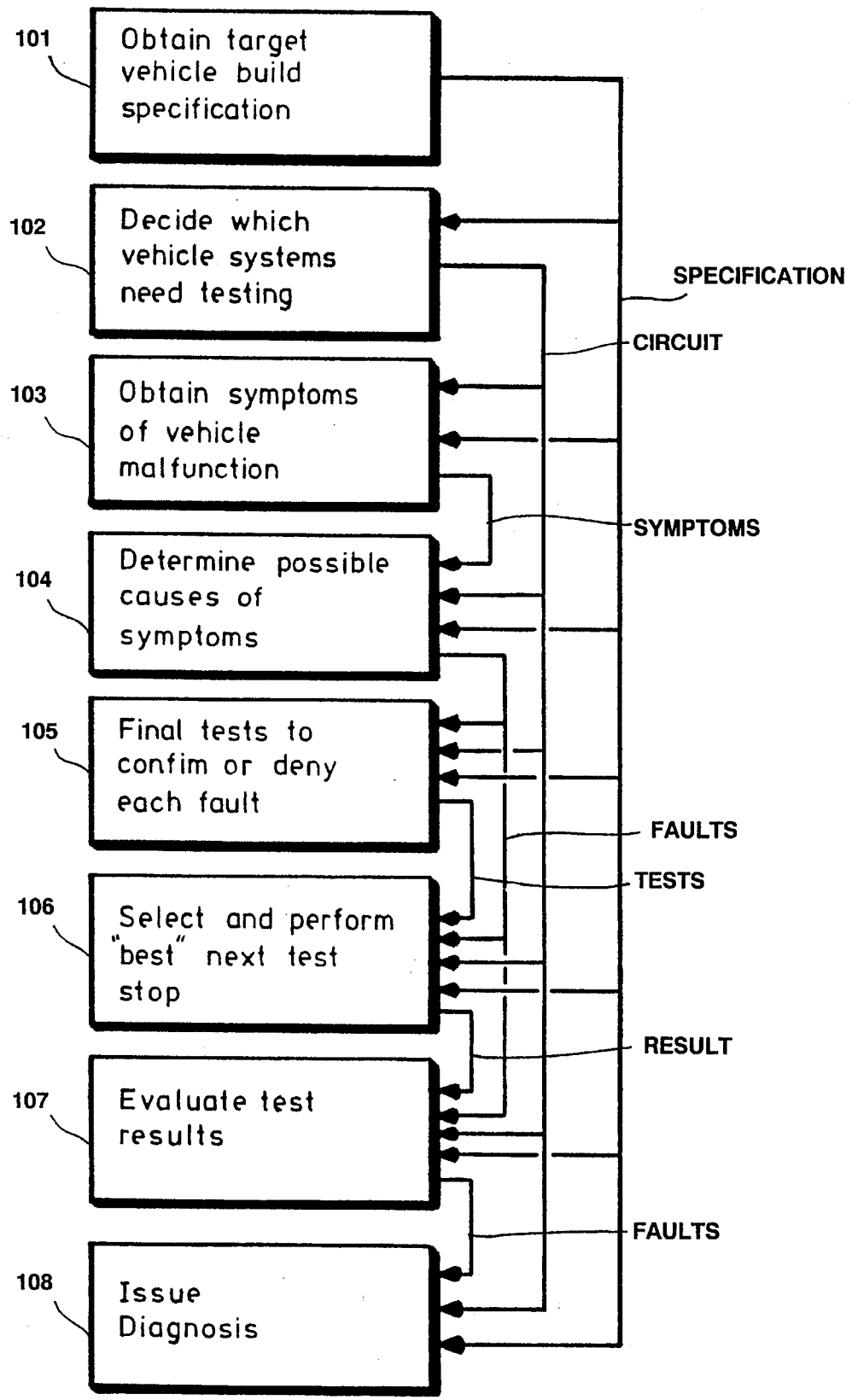
FIG. 1 is a schematic illustration of a systematic approach followed in an embodiment of the present invention.

FIG. 1 is a schematic illustration of the systematic approach to fault diagnosis followed by one system operating in accordance with the present invention. There are eight basic stages 101–108 which are generally executed sequentially although in some circumstances it is necessary to loop back in the sequence to refine the process. Each of these eight stages is described in general terms below, and a specific example of the analysis of one fault is then described in greater detail.

A major advantage of the present invention is that although a direct connection to the vehicle could be made this is not necessary. Accordingly the system can be used for diagnosis of any vehicle for which a full circuit description is available. This does mean however that the system must be informed as to which vehicle (the target vehicle) is to be tested. The first stage 101 of the sequence is accordingly concerned with basic target vehicle identification to access the target vehicle build specification.

The system stores comprehensive data fully describing every component of the electrical circuit of each potential target vehicle, and all the interconnections between every component in each potential target vehicle. A component could be a simple two terminal device, e.g. a switch, or a part of a sub-assembly, e.g. a wire in a harness made up from a number of wires. The first stage is thus concerned with identifying the full circuit specification of the target vehicle from the stored data describing all potential target data.

The user could be presented with a series of questions to enable vehicle identification, e.g.:

Maker? (e.g. Ford)

Model? (e.g. Testerosa)

Market (e.g. Norway/Sweden)

Trim? (e.g. GTi)

Model Year? (e.g. 1992)

Bodyshell? (e.g. 4-door)

Drive-Side? (e.g. right hand drive)

Such an approach would be valid, as precise target vehicle data could be obtained. In many cases however, some of the questions outlined above would be redundant. For example, there is no need to identify drive-side if diagnosis of a fault does not require this information as the fault is in a sub-system which is the same for left and right hand drive vehicles. To avoid redundant questions, the system is arranged such that the first stage feeds data to subsequent stages only when this is necessary. Thus the first stage is in effect consulted only when it is necessary for data to be provided for use in subsequent stages.

Figure 2:
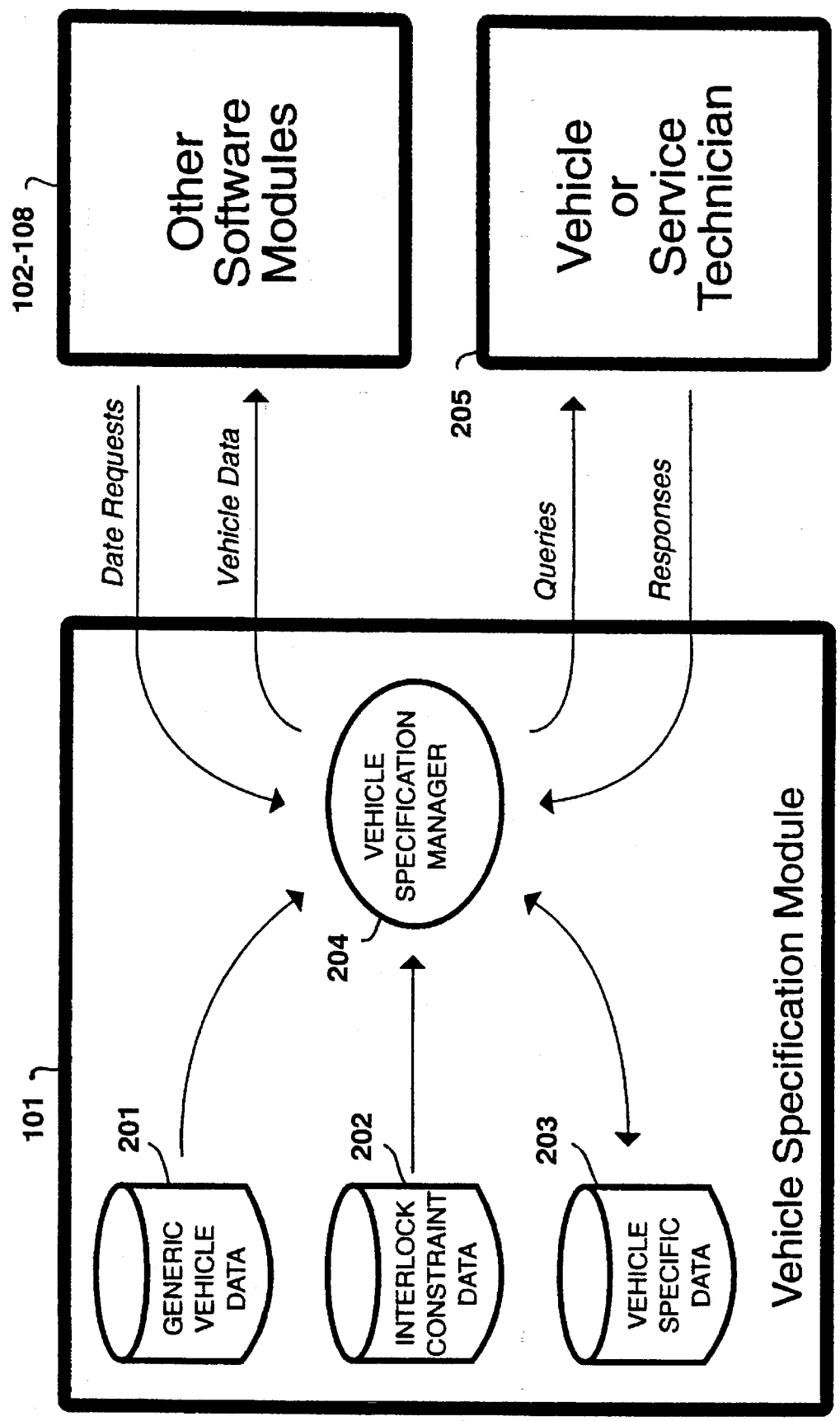
FIG. 2 is a schematic representation of the flow of data in a first stage of the embodiment of the present invention.

An outline of the vehicle specification module 101 is shown in FIG. 2. Generic vehicle data 201 is the component and build data for all potential target vehicles. Interlock constraint data 202 describes invalid combinations e.g. right hand side drive for USA market. Vehicle specific data 203 describes the current system knowledge of the target vehicle.

The interlock constraint data enables a reduction of the number of questions asked by the vehicle specification manager 204 where the answer to one question enables the answer of the subsequent questions to be determined. For example, it is not necessary to ask the drive side if the market has already been identified and the market defines the answer, e.g. market USA predetermines that the drive side is left hand. Thus the number of questions asked of the vehicle or service technician 205 may be reduced to a minimum.

Figure 3:
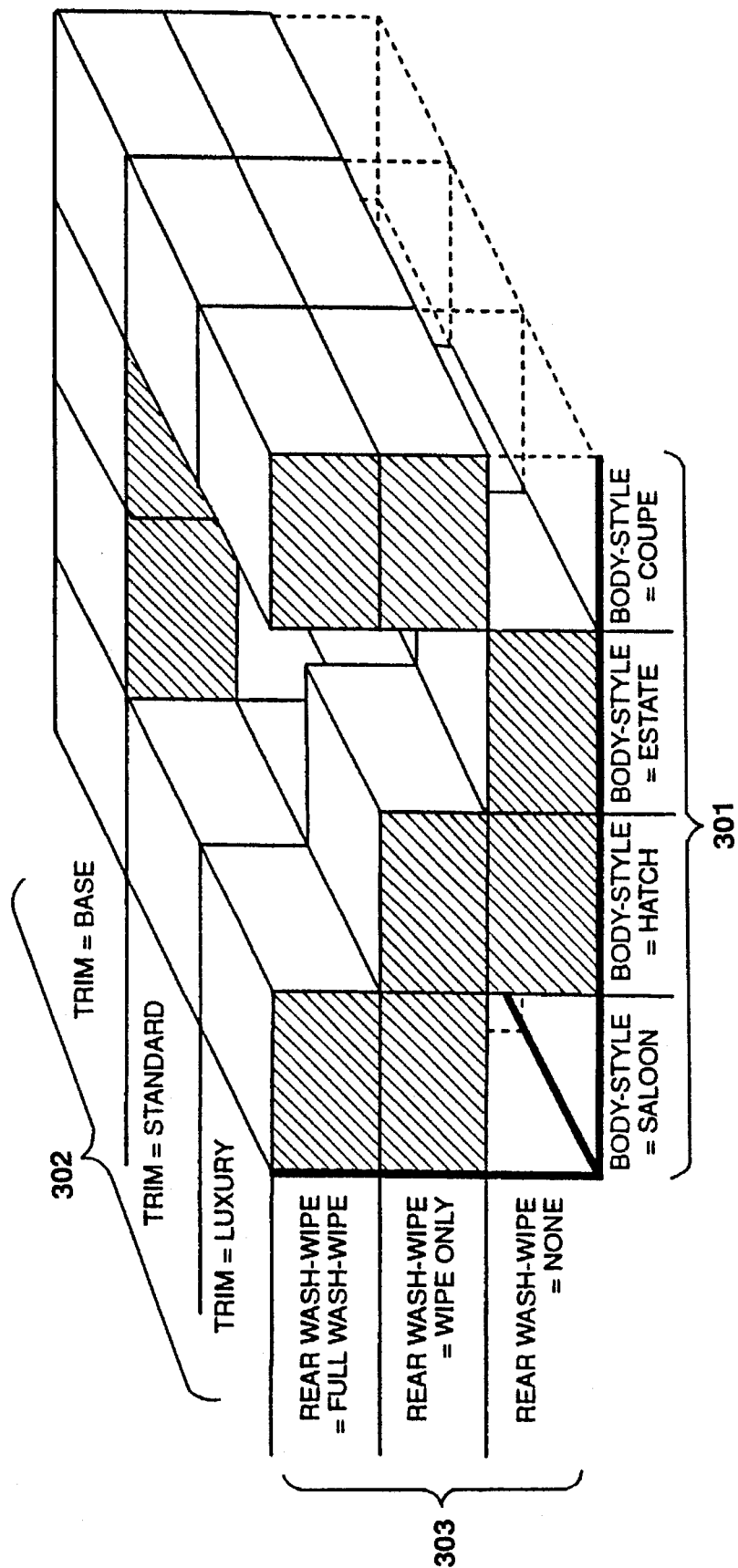
FIG. 3 illustrates an interlock constraint example.
Figure 4:
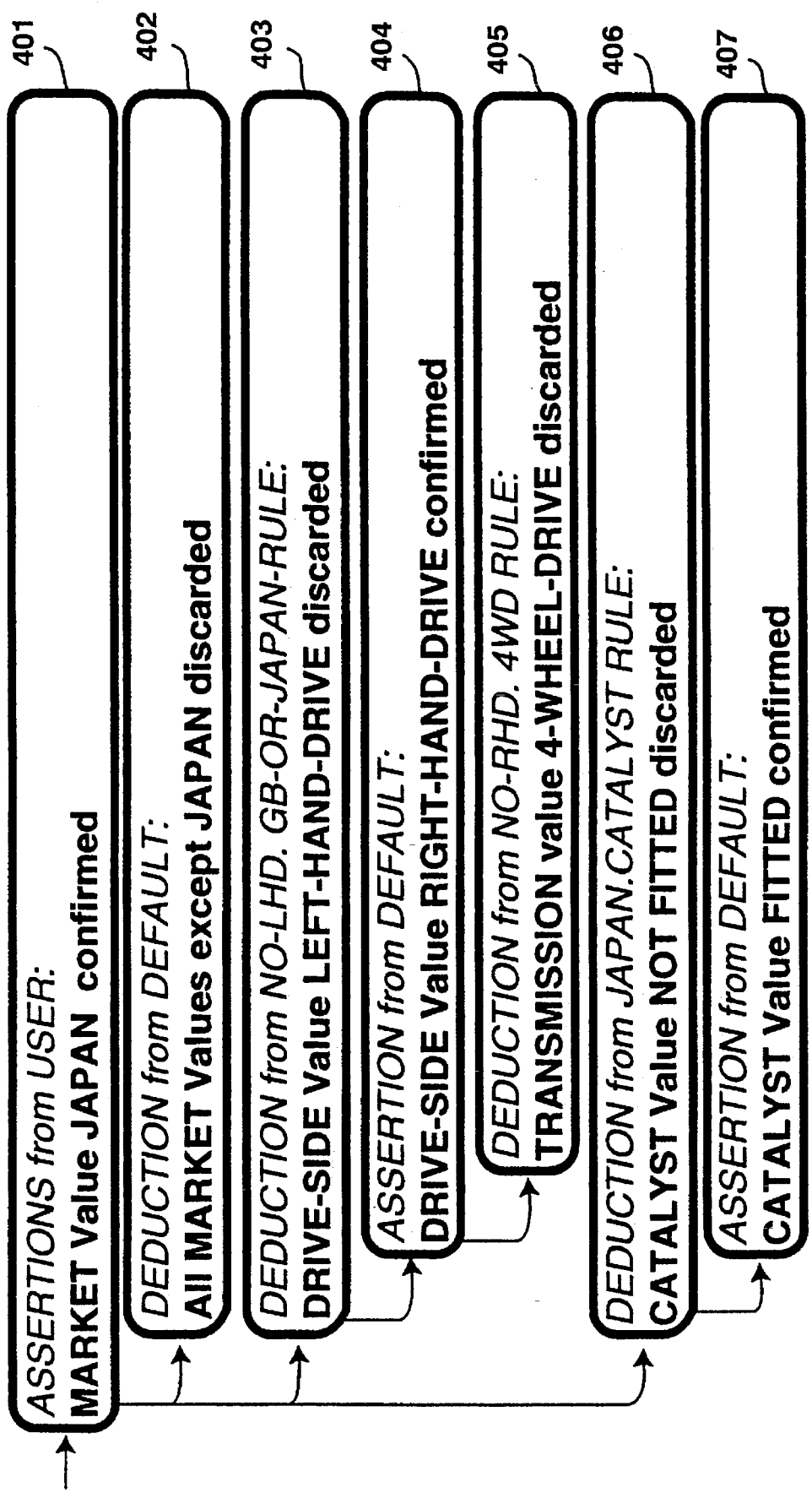
FIG. 4 illustrates an interlock rule trace example.

The second stage 102 determines the vehicle system requiring testing. In combination with the first stage 101, various vehicle system possibilities may be readily eliminated. For example, FIG. 3 shows an interlock constraint set example relating bodyshell (bodystyle) 301, trim 302 and wiper 303 options. From FIG. 3 it is apparent that for the saloon version rear wash-wipe is not an option even with luxury trim. Thus in this case rear-wash wipe circuitry will be omitted from the target vehicle specification and no subsequent queries will be made with regard to rear-wash wipe circuitry. FIG. 4 illustrates an interlock rule trace in greater detail. Thus, once the user indicates at 401 that the market is Japan, the system automatically confirms 402–404 that the target vehicle is right hand drive, discards the possibility of four wheel drive at 405, and confirms that a catalyst is fitted at 406–407. The system thus acquires knowledge incrementally, requesting data from the user only when needed.

Figure 5:
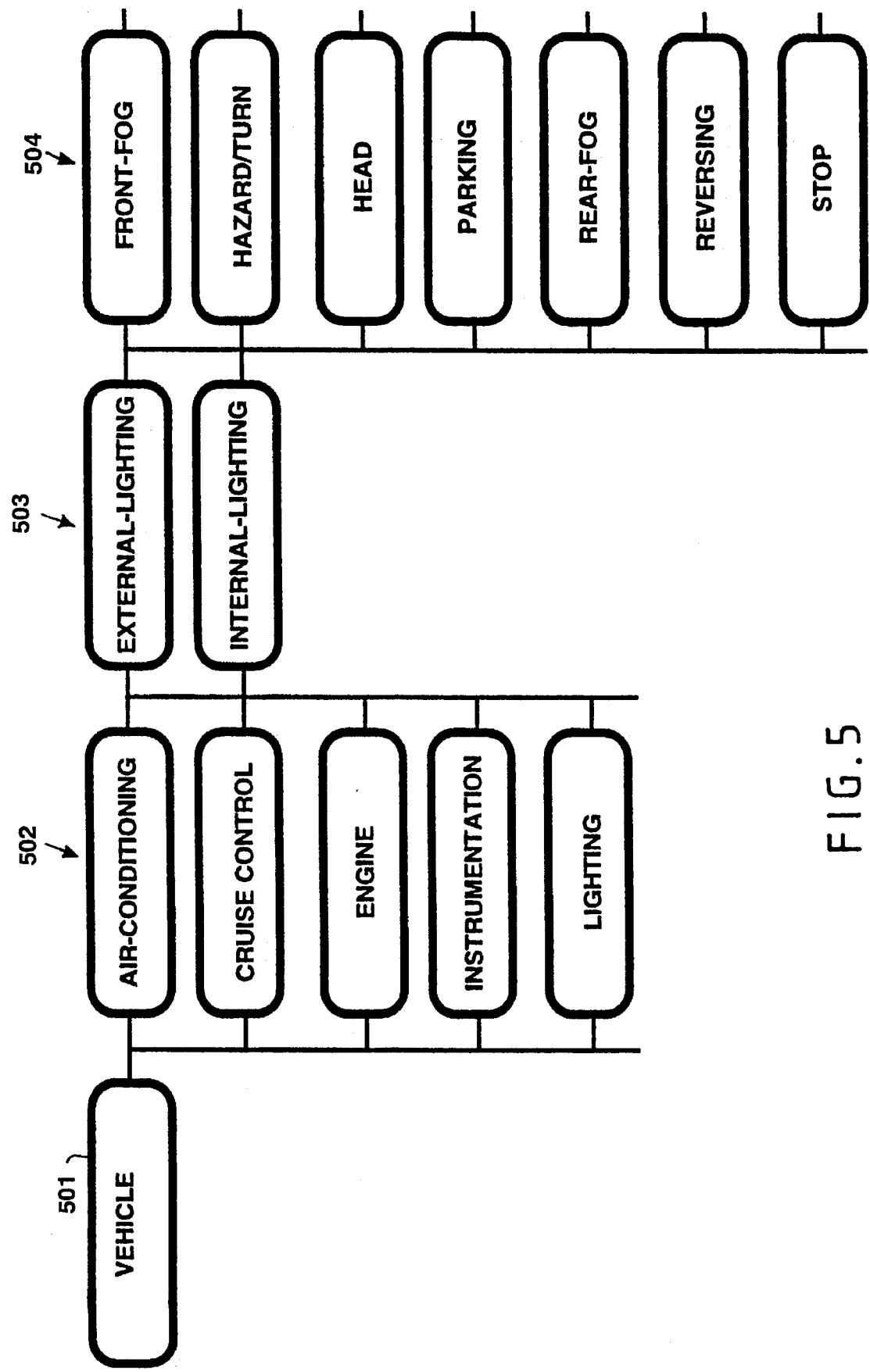
FIG. 5 illustrates a functional area hierarchy example.
Figure 7:
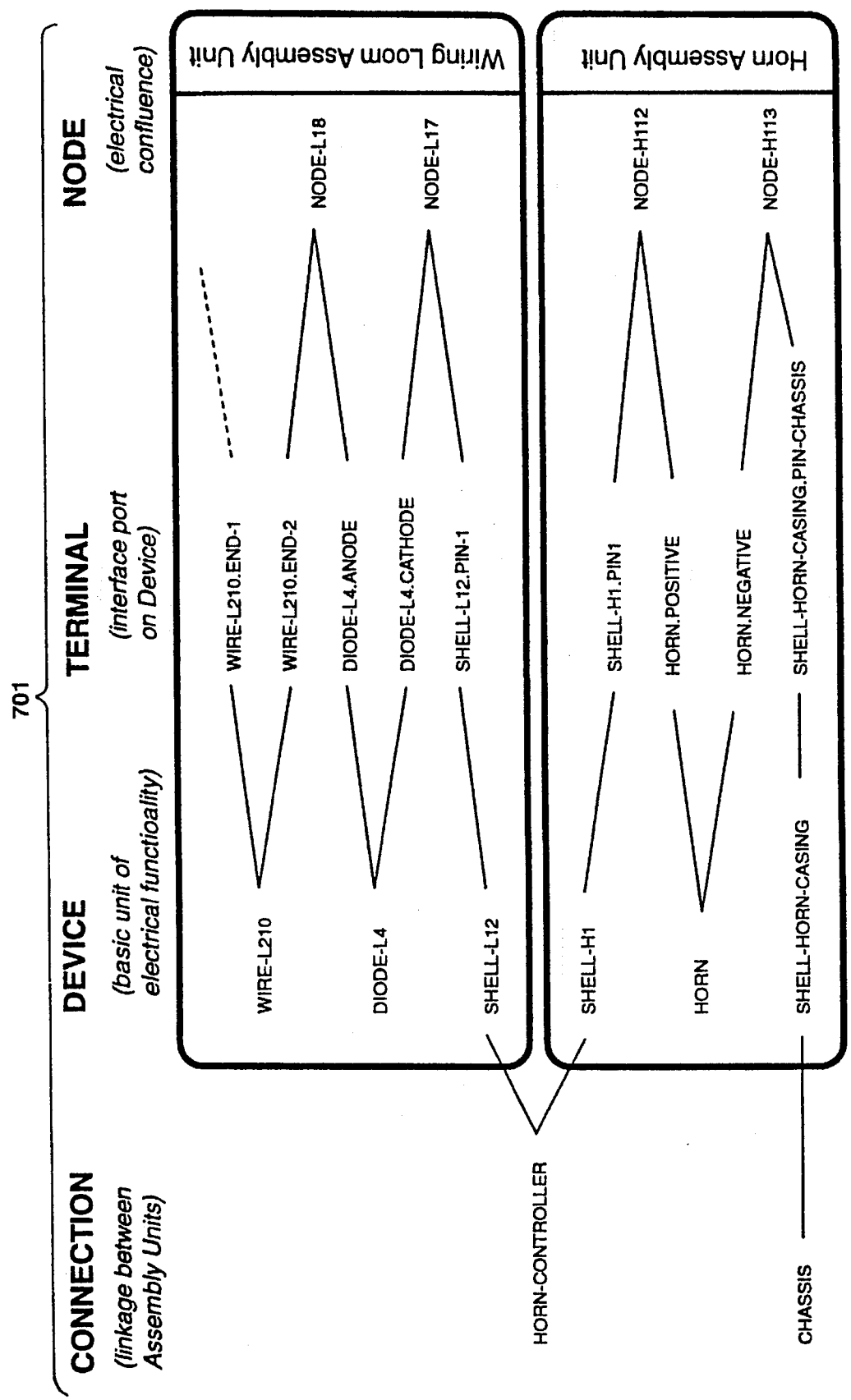
FIG. 7 illustrates an example of a representation of circuit components.

Turning now to the second stage 102 in greater detail, FIG. 5 illustrates one example of a vehicle functional area hierarchy 501. The user selects the functional area in which a problem has been perceived, e.g. the head lights, by sequentially selecting "lighting" at 502, "external lighting" at 503, "head" at 504. Selection may be achieved for example by positioning a cursor on a screen displaying the selection options, or by use of a touch screen. FIG. 7 illustrates the screen 701 perceived after "head" has been selected. Thus the user can rapidly isolate that section of the target vehicle specification of interest.

Once a specific vehicle area such as Head Lights has been identified, the system consults its database to obtain the relevant circuit details. As described above, the database contains descriptions of all components for all known vehicles.

Vehicle components are stored in a two-level representation: the higher level corresponds to items such as harnesses, lamps and relays which may be fitted to or omitted from specific vehicles: the lower level corresponds to basic electrical building blocks, such as wires and external connection points (e.g. connector pins), within the higher level items. An example is illustrated in FIG. 7.

Each higher-level item is tagged with a description of which vehicles it is fitted to and how many instances are fitted to those vehicles (e.g. a particular courtesy light switch might only be fitted to cars with central locking and there may be either two or four needed depending upon how many doors the car has).

Each lower-level item is tagged with a description of which vehicle systems that component participates in. Thus, the vehicle battery will probably be tagged with virtually every system whereas the courtesy light switches will only be tagged with the courtesy light system.

Using these tags, it is possible to identify:

higher-level components which are fitted to the vehicle

Lower-level components within these which are relevant to the circuit under analysis links from the circuit under analysis to other vehicle circuits (necessary for diagnosing some short-circuit faults)

It may be necessary to ask further questions about the vehicle build specification at this stage in order to select the appropriate components.

The net result is a stream of lower-level component descriptions which is passed to the next stage.

All connectors form part of named interfaces. It is therefore possible to determine which connector components should be joined together to form a complete circuit. The named interfaces use the tagging scheme described previously so further vehicle specification questions may be asked at this stage.

Once the connector components have been matched, it is possible to allocate appropriate graphical representations for each of them (e.g. mated pin/socket, unmated socket, unmated pin). Connector components and splices have schematic positional information associated with them (again using the tagging system). Thus as described below, the full circuit of interest may be displayed on a screen, the display being laid out automatically using a set of heuristic layout rules.

The third stage 103 is concerned with obtaining symptoms of the vehicle malfunction to be investigated. It is assumed that all electrical anomalies are propagated through output transducers. For those output transducers which the vehicle user might be expected to perceive directly, such as lamps, a menu is generated asking which transducers are believed to malfunction. These directly-identified output transducers, in conjunction with any transducers which cannot be perceived directly (such as fuel injectors) are each used as the starting point of a qualitative circuit analysis. This analysis aims to identify the valid states of the target output transducer and relate these to input transducer states and electrical circuit paths. Thus a particular headlamp bulb may have states OFF and BRIGHT in one circuit but, in another circuit, it could also be DIM. An example of such an analysis is described in greater detail below.

A menu is created asking which states are causing problems. If there is more than one combination of input transducer states which should result in the problem output transducer state and the input transducers involved are manually-operable then a further menu is created which seeks information about those input transducers.

The symptom menus offer a three-way choice for each option:

GOOD—definitely no problem

BAD—problem definitely present

UNKNOWN—problem may be present

This allows incomplete information to be entered and reduces the incentive to guess.

The outcome of this phase is a set of symptoms of alleged incorrect behaviour (or a set of symptoms of unknown behaviour) possibly supplemented by a set of symptoms of alleged correct behaviour.

A symptom is a declaration of how a vehicle function performs under a defined set of conditions. Symptoms have two prime attributes, that is conditions and their results. Conditions are related to vehicle system inputs, e.g. switch position, and results are related to vehicle system outputs, e.g. lamp state "bright" (seen), heater state "off" (not seen). Relevant output transducers are identified (by query if necessary). Electrical paths to relevant transducers and conditions are identified. Expected responses of output transducers to conditions are calculated. The technician is asked to classify each condition as good, bad or unknown. Querying is hierarchic and expands bad results only. For example, if the problem is with the courtesy lights, the following queries may be made:

Courtesy Lights: where is the problem?

| LEFT Courtesy Lamp | Unknown Bad Good |
| RIGHT Courtesy Lamp | Unknown Bad Good |

Assuming that the technician selects "Bad" for "Right Courtesy Lamp", then:

Does the Right Courtesy Lamp have a problem?

| with its OFF state? | Unknown Bad Good |
| with its BRIGHT state? | Unknown Bad Good |

Assuming that the technician selects "Bad" for "with its Bright state" then:

Does the Right Courtesy Lamp BRIGHT problem occur?

| when the DRIVER'S DOOR is open? | Unknown Bad Good |
| when the PASSENGER'S DOOR is open? | Unknown Bad Good |

The technician will then select the appropriate output, e.g. "Bad" for "when the passenger's door is open". For any question to which no reply is given, a default answer of "unknown" is assumed.

Having identified the relevant symptoms, the possible causes of these symptoms must be identified in the fourth stage 104. Each symptom is considered individually. The appropriate output transducer is asked to account for the symptom, which it does by identifying any appropriate internal failure mechanisms and/or proposing external causes and asking other devices connected to its terminals how they might account for those causes. In this way, all possible causes are generated. A cause consists of a device (e.g. wire), a failure mode (e.g. open-circuit) and a notional likelihood of occurrence (e.g. 5, 10 or 50).

Any cause which is proposed by all bad symptoms and no good symptoms is given a high priority. All other causes arising from bad symptoms are given a low priority. Subsequent diagnosis initially concentrates exclusively on high priority causes. Only if all high priority causes are disproved are the low priority causes considered. This ensures that simple faults are diagnosed quickly and efficiently whilst allowing complex faults to be diagnosed eventually.

For example, if there are two door switches controlled respectively by the passenger and driver side doors and controlling two courtesy light bulbs in parallel, and the passenger's door switch will not turn the right (drivers) courtesy light on, but the driver's door switch will turn the courtesy light on, the passenger's door switch subcircuit is assumed to be high priority, and the right courtesy lamp subcircuit to be low priority.

The vehicle is then set up for testing. A bad symptom is selected. The vehicle is placed in the allegedly failing state and the output transducer state checked. If all appears well, a warning of possible intermittency is issued and, if further bad symptoms are present, the process is repeated using a different bad symptom. If no bad symptom is reproducible then the diagnosis process is aborted. Otherwise it proceeds to the test generation phase.

The next (fifth) stage 105 is test generation. A rigorous analysis of exactly what is the "best" test to perform next is generally possible but the computing power required for all but the most trivial of circuits becomes immense. Given that the data upon which test selection is based (e.g. component failure rates) is subject to considerable inaccuracy, it is reasonable to use heuristics to achieve a good, if not absolutely optimum, selection of tests (c.f. chess playing computer programs).

The approach adopted is to treat the tester, vehicle and service technician as state machines. Initially, only composite states similar to the existing state are considered. Tests are generated using each of these states. The test generation method used determines how every observable circuit parameter (e.g. current, voltage, output transducer state) will vary in the presence of each high-priority cause. Any parameter which differs measurably depending upon which high-priority faults are present can form the basis of a useful test step.

The quality of these potential tests is assessed heuristically, using estimates of the following parameters:

Direct Cost—how much service technician time the test step will take

Amortised Cost—how much of the cost of a test step may be spread over several test steps (e.g. removing a trim panel may be time-consuming but could allow several subsequent tests to be performed cheaply.

Benefit—the amount of information which can be expected from the test step

Scope for Error—how difficult the test step is to perform correctly

Prohibitions—e.g. not probing close to the fan when the engine is running

Timing Constraints—minimum and maximum inter-step delays

Functional Constraints—e.g. avoid unmating connectors which may be failed open circuit since this may inadvertently remove the fault Strategic Considerations—restrict the number of test strategies being performed in parallel, both to ease the computational overhead and to prevent the appearance of having no coherent strategy Desirability of State Change—whether the test step would result in a composite state which is more or less useful than the present composite state A heuristic assessment is made of the likelihood of obtaining a more satisfactory test if a greater range of composite states were to be considered. This may lead to further test generation cycles. When no further cycles are deemed useful, the most promising test candidate is selected for execution.

The next stage 106 is selection and performance of the "best" test step. The test step selected is presented to the service technician. The service technician may decline this test step, in which case the system will attempt to present an alternative, or he may suggest a preferred test step, in which case the system will warn if it considers the proposed step to be of no value. These interactions are centred around the schematic display and are performed by moving icons representing measurement tools around the schematic.

Each test step consists of a setup phase followed by a measurement. Both of these phases may consist of a mixture of manual actions (taken by the service technicians in response to prompts) and automatic actions (performed by direct electrical connections between vehicle and tester).

The result of each measurement is evaluated in the next stage 107. Each result is propagated consistently throughout the vehicle model and is used to reassess the status of all potential causes of the fault. Potential causes may be reclassified as one of:

High-Priority—to be considered in choosing the next test step

Low-Priority—consideration deferred until no high priority entries remain

Definite Bad—the fault has been proven to exist

Definite Good—the fault has been proven to be absent

Irrelevant—the fault is not relevant to the symptoms being analysed

As soon as any cause has been identified as Definite Bad the final stage 108 issues an appropriate indictment statement, together with a justification; e.g. "Wire 5 in Driver's door harness has failed open circuit since it has Ov on one end and 11.7 volts on the other". For some classes of device, the criteria for moving them into the Definite Bad category can be quite complex, e.g. if it is found that a fuse has blown, a check is made for downstream short circuits (by rerunning the entire diagnostic process with fuse xxx blown as the only symptom) before declaring that the fuse is faulty.

The potential fault determination strategy outlined above will now be described in greater detail. A potential fault has three attributes, that is an identification of the device, an identification of a single failure mode (e.g. stuck off, open circuit, functional failure) and an estimation of the relative frequency of occurrence of such a fault (i.e. a lamp is more likely to fail open circuit than a wire). Potential faults are generated in response to messages sent to device software objects. Typical messages are: "what does your failure to provide x volts on pin y imply" or "what does your ability to provide x volts on pin y imply". A seed message is sent to each suspect output transducer. A device may propose internal faults and/or messages to adjacent devices. All potential faults from a particular symptom are grouped together, as illustrated in FIG. 8.

Figure 8:
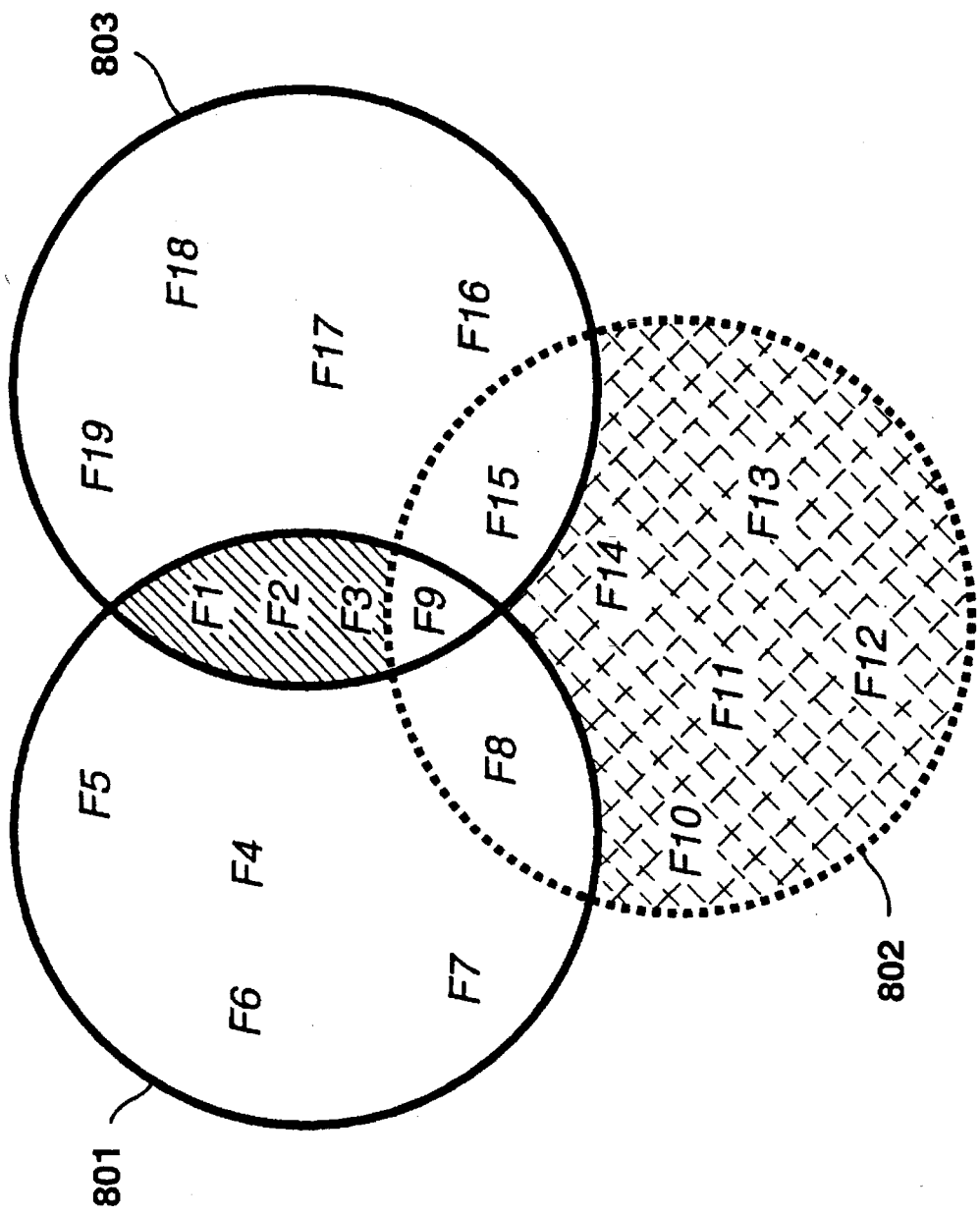
FIG. 8 illustrates initial faults population partitioning.
Figure 9:
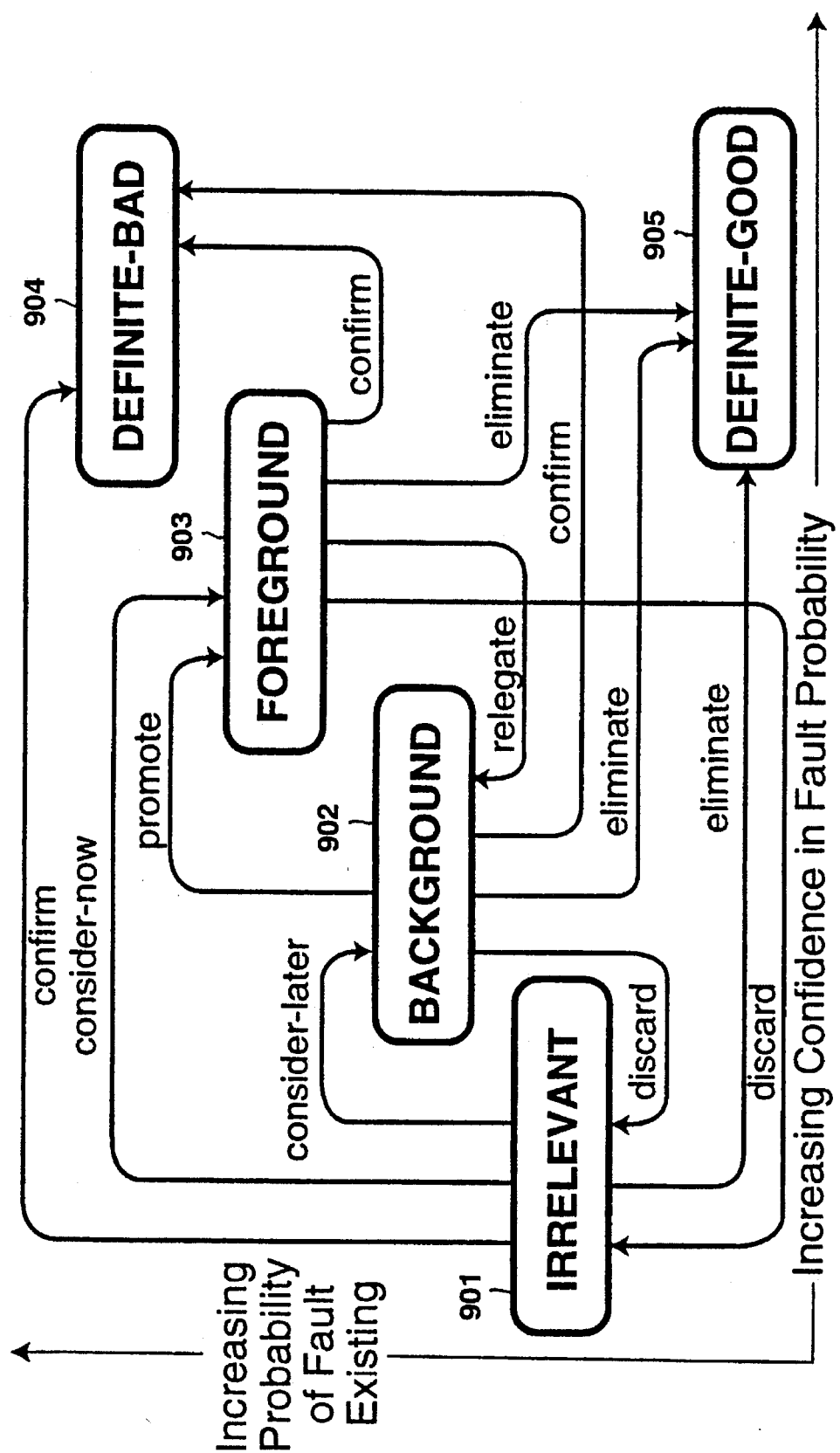
FIG. 9 illustrates a fault reassignment activity.

FIG. 8 illustrates initial fault population partitioning. The full line 801 surrounding potential faults F1 to F9 represents one bad symptom, the broken line 802 surrounding potential faults F8 to F15 represents one good symptom, and the full line 803 surrounding potential faults F1 to F3, F9 and F15 to F19 represents a second bad symptom. The area occupied by faults F1 to F3 is considered as foreground, that is high priority potential faults as they are proposed by all bad symptoms but no good symptoms. The area occupied by faults F4 to F9 and F15 to F19 is considered as background as they are proposed by at least one bad symptom but are not in foreground, whereas the area occupied by faults F10 to F14 is considered to be irrelevant. It is possible the faults F8, F9, and F15 are not relevant, as they are within the good symptom boundary, but as they are within bad symptom areas they are not discarded as certainly irrelevant. After the initial fault assignment illustrated in FIG. 8, individual faults are reassigned from one category to another on the basis of the results of further data gathered by executing tests. Fault reassignment activities are schematically illustrated in the flow chart of FIG. 9 at decision status blocks 901–905.

FIG. 10 illustrates a fault population display example which would be displayed at the end of test evaluation. "Definite faults" correspond to faults identified as definitely bad, "possible single faults" as foreground, and "possible components of multiple faults" as background. As the fault assignment activities progress individual faults move between these three categories. The prime objective is to move at least one candidate fault into the definite bad category. The secondary objective is to keep the background comprehensive so that complex faults may be diagnosed eventually. The tertiary objective is to ensure that the foreground population is small to ensure that simple faults are diagnosed quickly. Definite good candidates (e.g. F8, F9, F15) are used in tactical reasoning.

Figure 11:
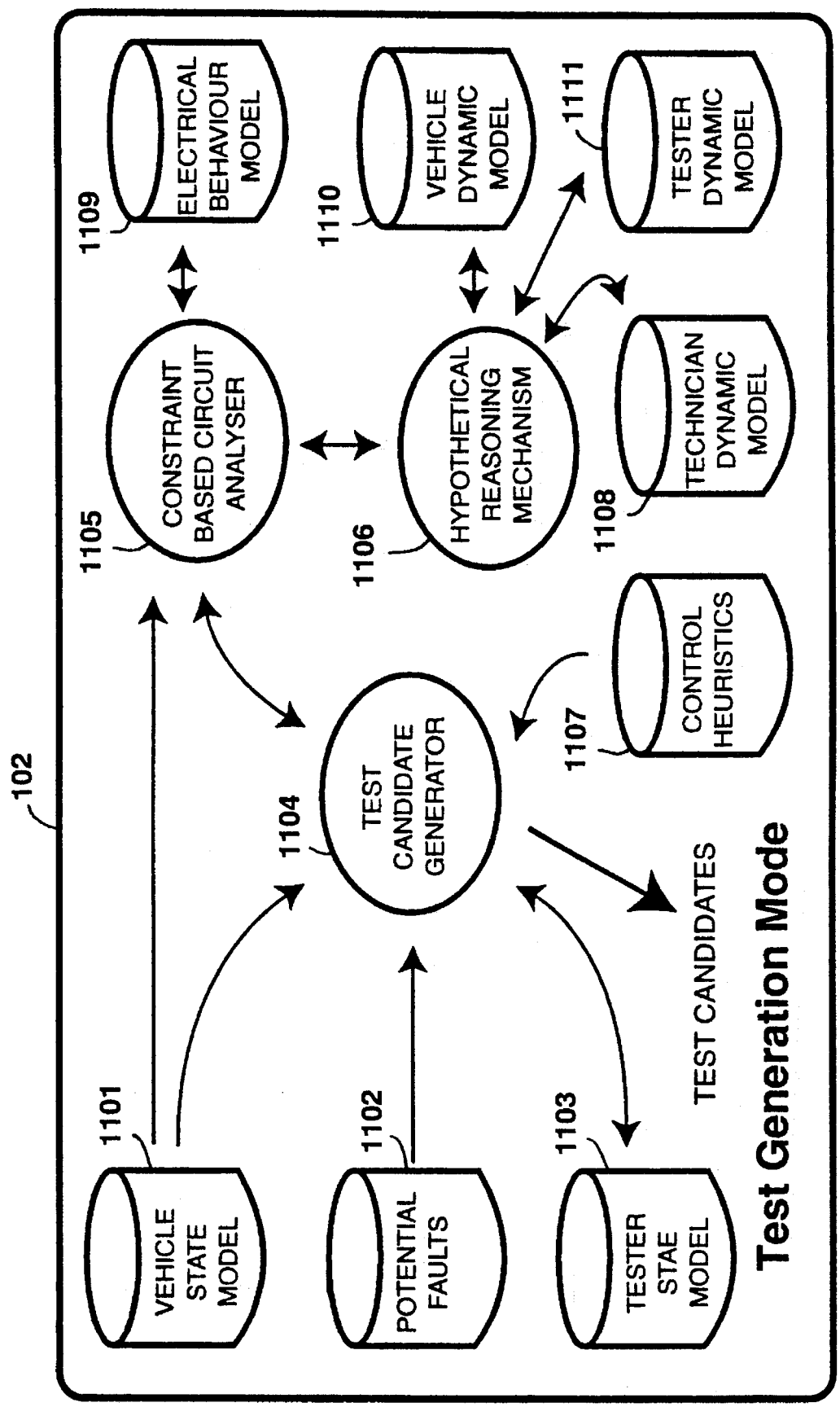
FIG. 11 illustrates a test generation module.

The test generation strategy relies upon a test step having three phases, that is set up (to get the tester, vehicle and technician into appropriate states) measurement (obtaining information from the vehicle using a tester such as a voltmeter) and evaluation (to determine the significance of the measurement). To make efficient use of the technician, it is sometimes appropriate to interleave several unrelated test sequences. For this to succeed, setups may need to lock resources to prevent parallel tests from corrupting results (e.g. preventing the engine from being turned off for too long during a warm up wait). Measurements may need to be stored and recalled later for evaluation. Tests are proposed whose outcomes may be expected to vary depending upon which foreground faults are present. FIG. 11 schematically illustrates the test generation module 102 of the system including a generally illustrated flow between submodules 1101–1111.

Figure 12:
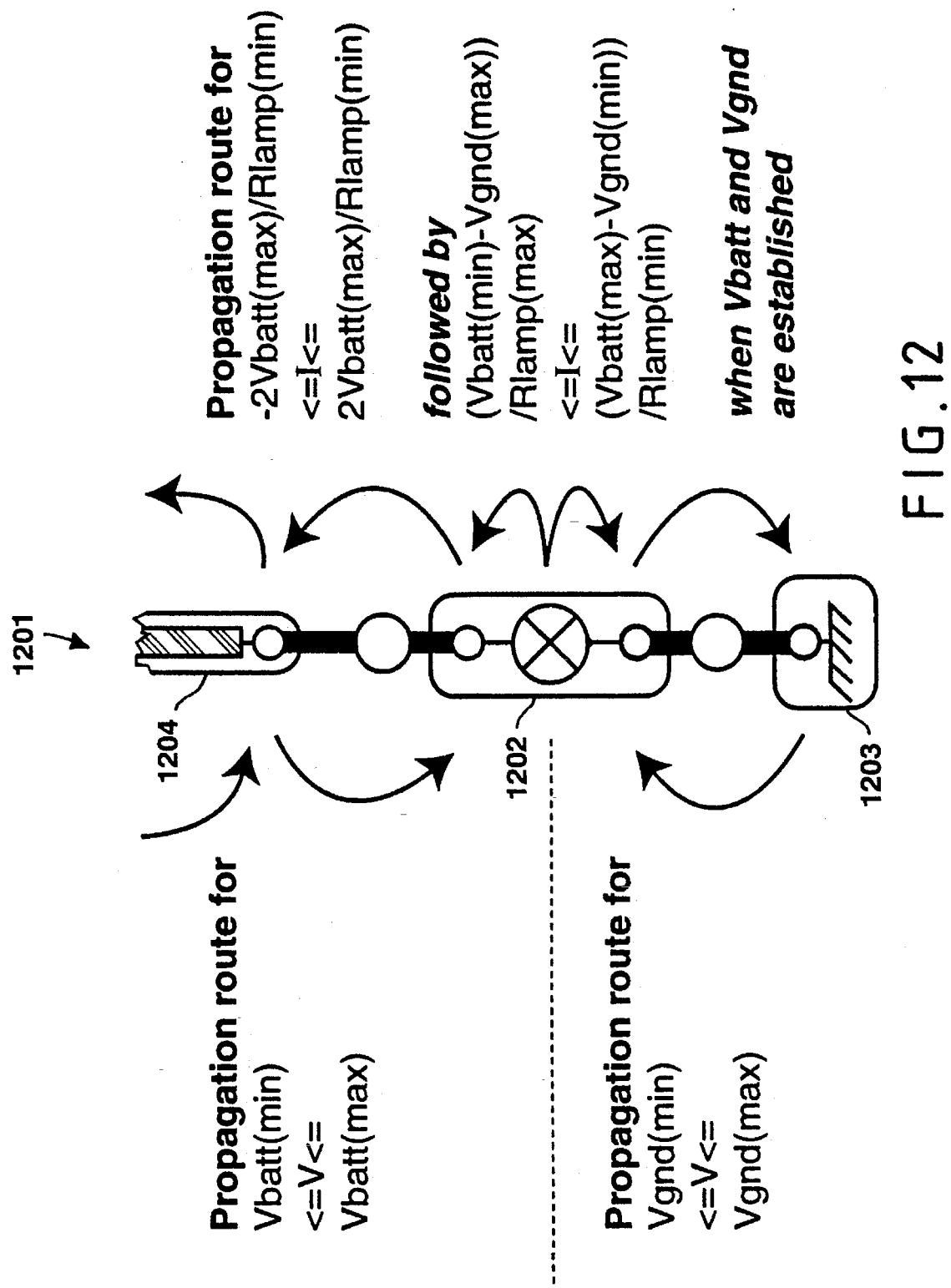
FIG. 12 illustrates a constraint propagation example.

Test constraints may be determined from circuit component parameters. This is illustrated in FIG. 12 which illustrates a simple series circuit 1201 made up from a lamp 1202 connected between ground 1203 and a wire 1204 connecting the lamp to the vehicle battery. If the vehicle battery voltage limits are Vbatt (min) and Vbatt (max), the vehicle ground voltage limits are Vgnd (min) and Vgnd (max), and the lamp resistance limits are Rlamp (min) and Rlamp (max), then test propagation routes may be as shown in FIG. 12. There are some circuit configurations which can cause problems as there are no voltage or current constraints given that configuration. One example is two switches connected in parallel and closed such that a current circulating through the switches could theoretically be infinite. Another example is a lamp connected between and in series with two open switches such that the lamp voltage is not constrained. It is necessary to avoid taking measurement at such components and to prevent nonsensical currents being considered as practical possibilities. Such problems can be avoided by appropriate software adjustments.

The instructions given to the technician with regard to the tests to conduct preferably includes graphical representations of the vehicle, the location of the point on the vehicle to be tested, a large scale representation of the appearance of the component to be tested and the point on that component to be contacted by the tester, and the nature of the tester to be used, e.g. a volt meter.

Figure 13:
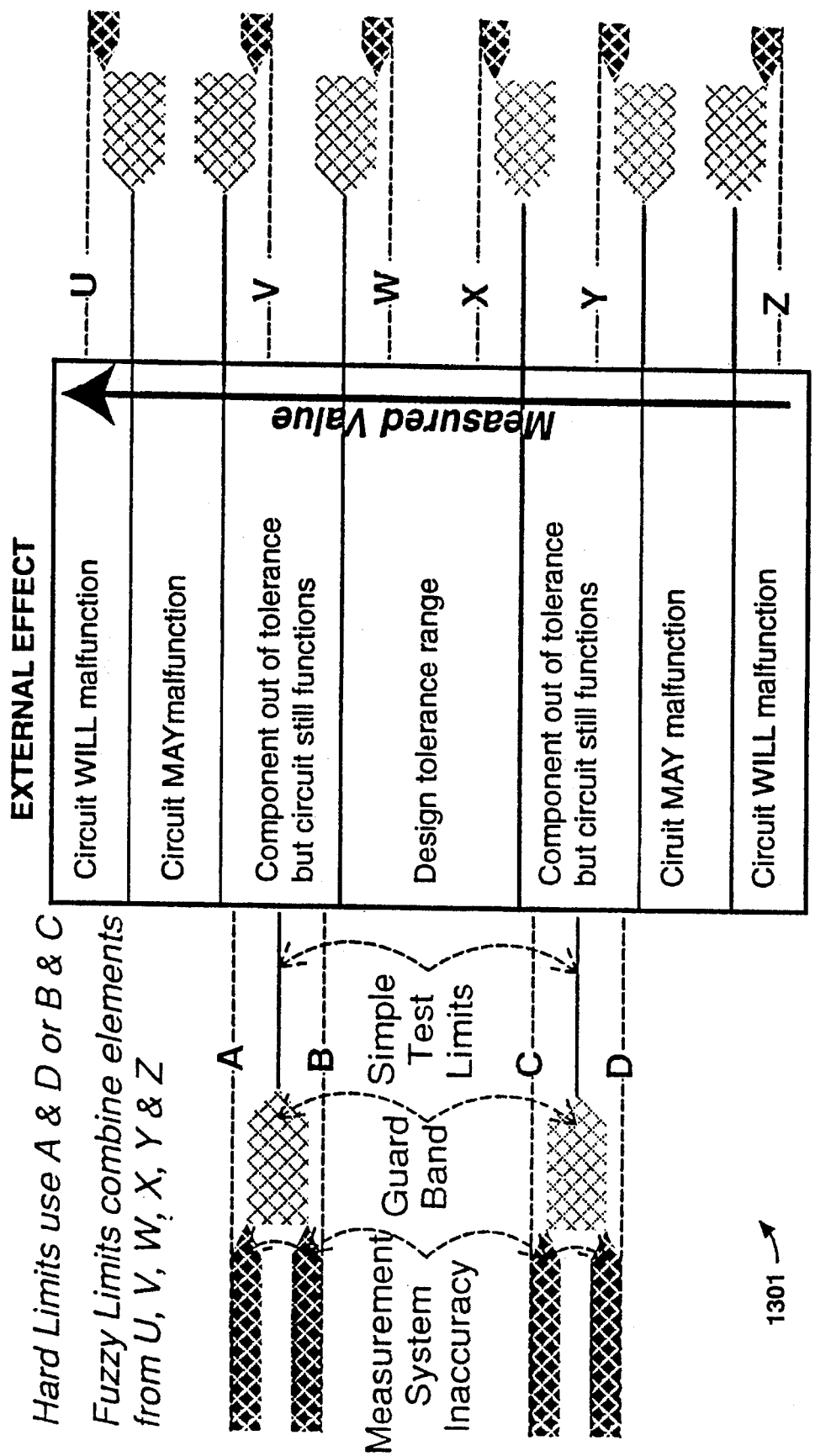
FIG. 13 illustrates test limit calculations.

Test result evaluation may be based on hard limits, i.e. too low, in range, too high, or "fuzzy" limits, i.e. too low, possibly low, in range, possibly too high, too high. This is illustrated in FIG. 13 at 1301.

Test results may be propagated to adjacent terminals where appropriate, for example a voltage reading through a wire whose open circuit fault status is definite good.

Faults are reassigned between foreground, background, irrelevant, definite bad, definite good using rules. Topographical rules are used to discard irrelevant faults. Functional rules are based on behaviour anomalies and are used to indict. Control rules are used to manage fault populations globally. Examples of such rules are given below:

TOPOGRAPHY RULE EXAMPLES

Since the voltage on Connector AB-35 pin 5 Male is IN-RANGE:
Using Rule DISCARD-FAULT-IF-ITS-EXPECTED-EFFECT-NOT-SEEN to justify DISCARDING
Wire-1 in Harness BH-0001=SHORT-TO-SINK Since the voltage on Connector AB-35 pin 7 Female is LOW:
Using Rule RELEGATE-FAULT-IF-ANOMALIES-OUTSIDE-ITS-SCOPE-SEEN to justify RELEGATING
Wire-3 in Harness BH-0001=OPEN-CIRCUIT
Wire-4 in Harness BH-0001=SHORT-TO-SOURCE

FUNCTIONAL RULE EXAMPLE

Since the voltage on Connector AB-35 pin 5 Male is IN-RANGE and the voltage on Connector AB-35 pin 5 Female is HIGH:
Using Rule PIN-OPEN-CIRCUIT-IF-DROPS-VOLTS-WHILST-MATED to justify CONFIRMING
Pin 5 in Connector AB-35=OPEN-CIRCUIT

CONTROL RULE EXAMPLE

Figure 14:
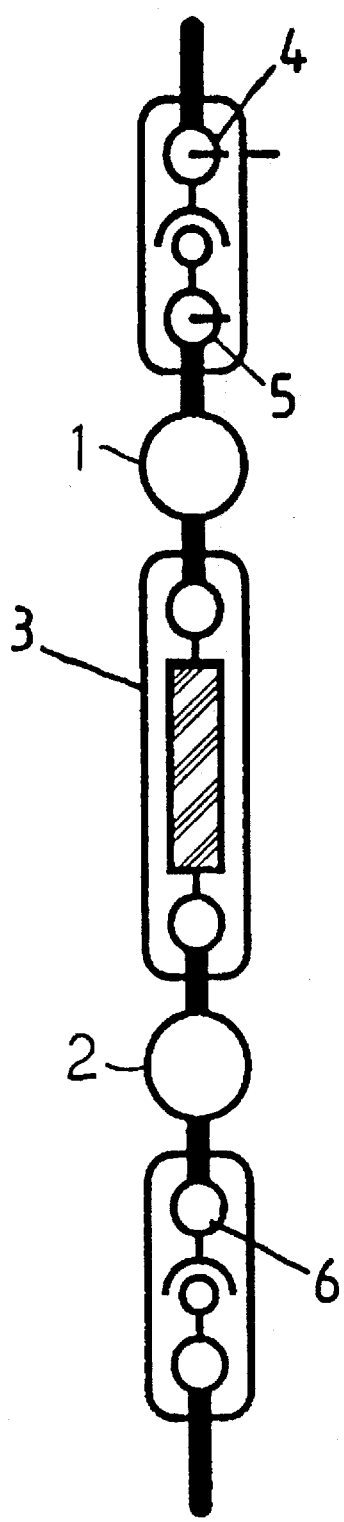
FIG. 14 illustrates the handling of intermittent and user errors.

Since the contents of FOREGROUND is NIL and contents of DEFINITE BAD is NIL:
Using Rule GET-NEW-FOREGROUND-FROM-BACKGROUND to justify PROMOTING
Wire-14 in Harness BH-0001=OPEN CIRCUIT
Wire-15 in Harness BH-0001=OPEN CIRCUIT Intermittent and user errors may sometimes cause problems. The system can be set up to reduce the probability of such errors. For example, referring to FIG. 14, connectors 1 and 2 are linked by wire 3. A voltage tester is applied sequentially to terminals 4, 5 and 6. The sensed voltage is in range for terminals 4 and 5, but low for terminal 6. A simple interpretation could find wire 3 to have failed open circuit. A more cautious approach would be to disconnect connectors 1 and 2, and measure the resistance between terminals 5 and 6 directly. If the resistance is high, the wire 3 can be indicted. If the resistance is in range, it is then necessary to look for an intermittent fault or check for a mis-probe.

Secondary faults can also give problems. These can be overcome by treating a potential secondary fault as a new bad symptom to be reassessed as are all other symptoms. Only if all possible faults which would give rise to the secondary fault symptom can be eliminated (e.g. declared irrelevant or good) is the original fault indicted as a primary fault.

Thus the diagnostic features provide various advantages. Firstly, consistency results from the use or one reasoning mechanism throughout. This simplifies tailoring of tests to specific customer requirements (e.g. whether or not to cross-check a suspected fault prior to indictment). Secondly, the system is extensible and may be connected to allied systems such as on-line workshop manuals, parts ordering systems, and systems intended to decide whether to replace or repair. Thirdly, the system is flexible. It is not necessary to run the entire system in the workshop. Some parts may be used in the dealers reception and work scheduling areas, and other parts may be used off-line to assist with or replace manual applications writing.

Figure 15:
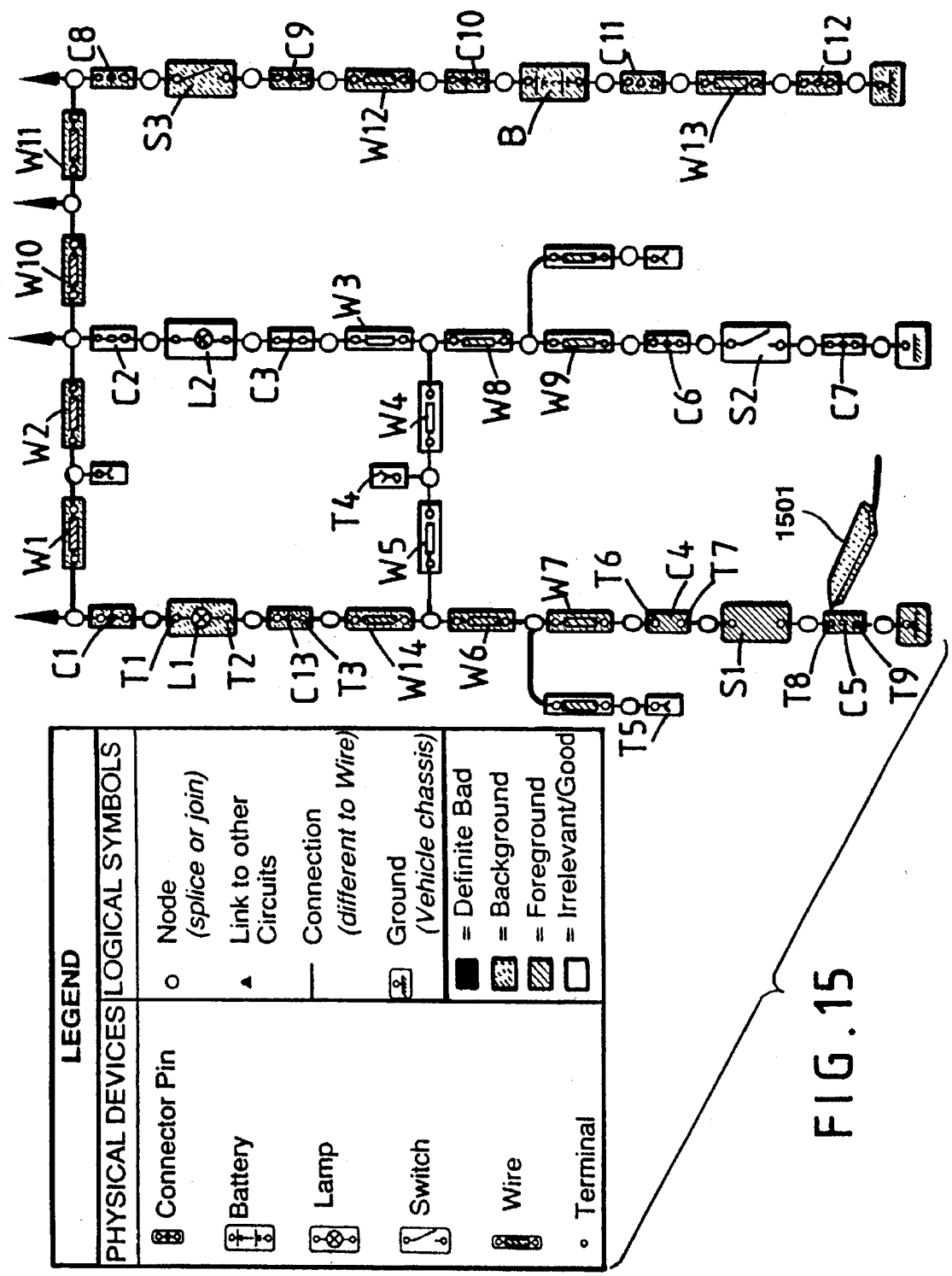
FIG. 15 illustrates a display produced by the system for a courtesy light circuit analysis.

Having described the full system in general terms, fault diagnosis of a simple circuit will now be described in detail. The circuit is illustrated in FIG. 15, which shows the components of a courtesy light circuit as it could be displayed to the user. The display is not stored as such in the database, but is generated from data describing the components and their interconnections stored in the database. The circuit is shown as finally displayed to the user after a voltage sensing probe 1501 has been applied to indict as faulty the connector at the bottom left hand corner of the circuit, the components being shaded as irrelevant/good, foreground, background, and definite bad in accordance with the legend set out on the left hand side of the Figure.

The circuit comprises left hand courtesy lamp L1, right hand courtesy light L2, passenger's door switch S1, driver's door switch 2, courtesy light disabling switch 3, battery B, and appropriate connectors C and wires W connected via terminals T. A malfunction is reported as the passenger's lamp L1 fails to go bright when the passenger's door is opened. Thus the output malfunction is identified as being related to lamp L1.

The system determines how many possible paths exist from L1 to vehicle ground. In this case there are six, that is three from terminal T1 (P1, P2, P3) and three from terminal T2 (P4, P5, P6)

P1: C1, W1, W2, C2, L2, C3, W3, W4, W5, W6, W7, C4, S1, C5

P2: C1, W1, W2, C2, L2, L3, W3, W8, W9, C6, S2, C7

P3: C1, W1, W2, W10, W11, C8, S3, C9, W12, C10, B, C11, W13, C12

P4: C13, W14, W6, W7, C4, S1, C5

P5: C13, W14, W5, W4, W8, W9, C6, S2, C7

P6: C13, W14, W5, W4, W3, C3, L2, C2, W10, W11, C8, S3, C9, W12, C10, B, C11, W13, C12

There are two further "floating" paths P7 (from T1) and P8 (from T2)representing all switches S1, S2, S3 open.

For each terminal T1, T2, of the transducer L1, the voltage and resistance of the paths leading to the terminal are assessed assuming no faults and no resistance in the connectors, wires, switches and battery:

| Path | Voltage | Resistance | Condition |
|---|---|---|---|
| | | For terminal T1: | |
| P1 | 0 | Rlamp | S1 closed |
| P2 | 0 | Rlamp | S2 closed |
| P3 | 12 | 0 | S3 closed |
| P7 | Floating | Infinite | — |
| | | For terminal T2: | |
| P4 | 0 | 0 | S1 closed |
| P5 | 0 | 0 | S2 closed |
| P6 | 12 | Rlamp | S3 closed |
| P8 | Floating | Infinite | — |

The system selects active and non-active paths from these eight possibilities on the basis of resistance. The rule used in this example is that any path which has more than five times the resistance of a path to the same terminal is non-active. The remainder are considered active. In this case, paths P3, P4 and P5 are active with all switches on.

There are three switches which can be off or on, giving eight possible switch position combinations. The expected output (state of lamp L1) is assessed for each of these possibilities:

| Switch condition (0 = open, C = closed) | | | Output |
|---|---|---|---|
| S1 | S2 | S3 | (0 = off, B = bright) |
| 0 | 0 | 0 | 0 |
| 0 | 0 | C | 0 |
| 0 | C | 0 | 0 |
| 0 | C | C | B |
| C | 0 | 0 | 0 |
| C | 0 | C | B |
| C | C | 0 | 0 |
| C | C | C | B |

| OFF | ACTIVE | PATHS |
|---|---|---|
| 000 | N1:- | N2:- |
| 00C | N1: P3 | N2:- |
| 0C0 | N1:- | N2: P5 |
| C00 | N1:- | N2: P4 |
| CC0 | N1:- | N2: P4, P5 |
| BRIGHT | ACTIVE | PATHS |
| 0CC | N1: P3 | N2: P5 |
| C0C | N1: P3 | N2: P4 |
| CCC | N1: P3 | N2: P4, P5 |

The user is asked if the fault is with OFF or BRIGHT.

The fault in this case is with BRIGHT, and thus it is only necessary to consider the three possible BRIGHT conditions. The OFF conditions may be discarded. The switch combination CCC adds nothing to the sum of OCC and COC, and therefore CCC can be discarded as a fault in one of the paths of the CCC group would also manifest itself in at least one of the other two groups.

The user is then asked to indicate when the output malfunction is apparent, that is when the passenger's door is open, and/or when the driver's door is open. The answer is "yes" to the question "when the passenger's door is open", and "no" to the question "when the driver's door is open".

The system can now deduce two symptoms:

Symptom 1 L1 does not go bright (result) for switch combinations COC (condition)

Symptom 2 L1 does go bright (result) for switch combinations OCC (condition)

The fault can now be analysed by listing all the possible faults that could contribute to each of the two symptoms:

| Potential Fault Number | Significance |
|---|---|
| | Symptom 1 |
| F1 | C5 open circuit |
| 2 | S1 stuck open |
| 3 | C4 open circuit |
| 4 | W7 open circuit |
| 5 | W6 open circuit |
| 6 | W14 open circuit |
| 7 | C13 open circuit |
| 8 | L1 open circuit |
| 9 | L1 wrong voltage lamp |
| 10 | C1 open circuit |

-continued

| | |
|---|---|
| 11 | W1 open circuit |
| 12 | W2 open circuit |
| 13 | W10 open circuit |
| 14 | W11 open circuit |
| 15 | C8 open circuit |
| 16 | S3 stuck open |
| 17 | C9 open circuit |
| 18 | W12 open circuit |
| 19 | C10 open circuit |
| 20 | B open circuit |
| 21 | C11 open circuit |
| 22 | W13 open circuit |
| 23 | C12 open circuit |
| Symptom 2 | |
| F24 | C7 open circuit |
| 25 | S2 stuck open |
| 26 | C6 open circuit |
| 27 | W9 open circuit |
| 28 | W8 open circuit |
| 29 | W4 open circuit |
| 30 | W5 open circuit |
| plus faults F6 to F23. | |

The potential faults can now be allocated to the foreground, background and irrelevant categories as follows:

Foreground: F1 to F5 (within bad symptom 1, not in good symptom

Background: F6 to F23 (within bad symptom 1 and good symptom 2).

Irrelevant: F24 to F30 (outside bad symptom 1)

Thus faults F1 to F5 are allocated the highest priority for immediate consideration.

The technician is instructed to set up the vehicle in the only bad symptom condition, that is passenger door open to close switch S1, and switch S3 closed. The system considers which accessible terminals of the circuit defining the foreground faults may be probed to locate the fault. These terminals are T3 to T9. The expected voltages in the presence of the faults F1 to F5 are:

| | T3 | T4 | T5 | T6 | T7 | T8 | T9 |
|---|---|---|---|---|---|---|---|
| F1 | 12 | 12 | 12 | 12 | 12 | 12 | 0 |
| F2 | 12 | 12 | 12 | 12 | 12 | 0 | 0 |
| F3 | 12 | 12 | 12 | 12 | 0 | 0 | 0 |
| F4 | 12 | 12 | 12 | 0 | 0 | 0 | 0 |
| F5 | 12 | 12 | 0 | 0 | 0 | 0 | 0 |

The technician is then instructed to test the voltage at terminal T7. This divides the potential faults into two groups. The sensed voltage is 12 volts, and thus the fault is in either S1(F2) or CS(F1). The system then prompts the technician to probe terminal TS, finds 12 volts, and therefore the fault must be in C5 (open circuit, fault F1). The fault has thus been fully diagnosed, and fault r1 is promoted to the definite bad category.

It will be noted that as an additional aid to the technician, the definite bad component C5 is highlighted by dark shading, foreground components S1, C4, W7 and W6 are illustrated by intermediate shading, and background components are illustrated by light shading. Shading may be updated as tests proceed. Colours rather than shading may be used for highlighting purposes.

Although the example described with reference to FIG. 15 is extremely simple, it will be appreciated that the same technique as used in the example can be applied to far more complex problems.

I claim:

1. A system for identifying faults in an electrical circuit intended to provide a plurality of outputs, each output being in response to at least one predetermined set of circuit conditions, the system comprising
   a) means storing data describing individual components of an electrical circuit and interconnections at circuit nodes between said components that together define the topology of the electrical circuit,
   b) means for inputting data to the system identifying a fault symptom indicating that, for one predetermined set of said circuit conditions, an intended output is not received or measured,
   c) means for accessing stored data describing the electrical characteristic of selected components of said circuits a fault in any one of which said selected components could be a cause of the said fault symptom,
   d) means for directly calculating, from the accessed data describing electrical characteristics of said selected components, expected electrical parameter values at predetermined measurement points in a non-defective sub-circuit defined by said selected components and said interconnections therebetween given the said predetermined set of circuit conditions,
   e) means for selecting measurement points in said sub-circuit at which points said electrical parameter values are to be measured,
   (f) means for selectively inputting measurement data indicating the electrical parameter values measured at said selected measurement points,
   g) means for providing a comparison of said input measurement data with said calculated expected electrical parameter values, and
   h) means for identifying at least one most likely faulty component from the comparison of said input measurement data with said calculated expected electrical parameter values.

2. A system according to claim 1, further comprising
   a) means for identifying, if possible, a single component responsible for the said intended output which is not received or measured given said one predetermined set of circuit conditions,
   b) means for inputting data to the system identifying further symptoms each indicating the output provided by said single component for a respective one of a plurality of further conditions of the said electrical circuit,
   c) means for listing components of said sub-circuit potentially contributing to each said identified fault symptom, and
   d) means for identifying components of the sub-circuit which are most likely to be a cause of said fault symptom from a comparison of the listed components.

3. A system according to claim 2, wherein the means for identifying a single component identifies, as a first set, components common to all identified fault symptoms.

4. A system according to claim 3, wherein the means for identifying a single component excludes, from the first set, components for any non-fault symptom.

5. A system according to claim 3, wherein the means for identifying a single component identifies, as a second set, components for any identified fault symptoms and not within the first set.

6. A system according to claim 2, comprising
   a) means for identifying every set of components in said sub-circuit which defines a series circuit path extending from the said single component to a reference voltage source, and b) means for identifying active circuit paths which control conditions at the said single component by reference to the series impedance of components making up a respective set of components, components not contributing to the active circuit paths being excluded from said listed components.

7. A system according to claim 6, wherein the means for identifying every set of components in said sub-circuit which defines a series circuit path comprises means for calculating a voltage change along each circuit path, means for calculating a series resistance along each circuit path, and means for selecting a circuit path having series resistance that is lower than for another circuit path.

8. A method for identifying a fault in an electrical circuit exhibiting a fault symptom and having electrical components with known expected electrical characteristics connected between circuit nodes in a pre-defined topography, said method comprising:

maintaining a data base defining a plurality of electrical circuits, including their electrical components and inter-node connections of same;

selecting, from the data base, data defining a particular sub-circuit of a circuit to be analyzed, including all interconnected components which are capable of causing said fault symptom;

generating, from said data base, a visual display of said particular sub-circuit and of selected test points therein;

calculating an expected value of electrical parameters at said selected test points based on the known expected electrical characteristics of components within said sub-circuit; and comparing measured values of electrical parameters at said selected test points with calculated expected values to identify a possibly faulty component within said particular sub-circuit.

9. A method as in claim 8 wherein a plurality of possibly faulty components are identified and including the step of simultaneously displaying an identity of such possibly faulty components with an indication of a relative probability of each component actually being faulty.

10. Apparatus for identifying a fault in an electrical circuit exhibiting a fault symptom and having electrical components with known expected electrical characteristics connected between circuit nodes in a pre-defined topography, said apparatus comprising:

means for maintaining a data base defining a plurality of electrical circuits including their electrical components and inter-node connections of same;

means for selecting, from the data base, data defining a particular sub-circuit of a circuit to be analyzed, including all interconnected components which are capable of causing said fault symptom;

means for generating, from said data base, a visual display of said particular sub-circuit and of selected test points therein;

means for calculating an expected value of electrical parameters at said selected test points based on the known expected electrical characteristics of components within said sub-circuit; and means for comparing measured values of electrical parameters at said selected test points with calculated expected values to identify a possibly faulty component within said particular sub-circuit.

11. Apparatus as in claim 10 wherein a plurality of possibly faulty components are identified and including means for simultaneously displaying an identity of such possibly faulty components with an indication of a relative probability of each component actually being faulty.

* * * * *